United States Patent
Palacios Laloy

(10) Patent No.: US 10,684,130 B2
(45) Date of Patent: Jun. 16, 2020

(54) METHOD FOR DETECTING ROTATION WITH RAPID START-UP OF AN ATOMIC GYROSCOPE WITH SEOP

(71) Applicants: COMMISSARIAT A L'ENERGIE ATOMIQUE ET AUX ENERGIES ALTERNATIVES, Paris (FR); SAFRAN, Paris (FR)

(72) Inventor: Augustin Palacios Laloy, Grenoble (FR)

(73) Assignees: COMMISSARIAT A L'ENERGIE ATOMIQUE ET AUX ENERGIES ALTERNATIVES, Paris (FR); SAFRAN, Paris (FR)

( * ) Notice: Subject to any disclaimer, the term of this patent is extended or adjusted under 35 U.S.C. 154(b) by 0 days.

(21) Appl. No.: 16/015,691

(22) Filed: Jun. 22, 2018

(65) Prior Publication Data
US 2019/0003833 A1    Jan. 3, 2019

(30) Foreign Application Priority Data

Jun. 28, 2017  (FR) ...................................... 17 55969

(51) Int. Cl.
*G01C 19/60* (2006.01)
*G01C 19/62* (2006.01)
*G01R 33/26* (2006.01)

(52) U.S. Cl.
CPC .............. *G01C 19/62* (2013.01); *G01C 19/60* (2013.01); *G01R 33/26* (2013.01)

(58) Field of Classification Search
CPC ......... G01C 19/60; G01C 19/62; G01R 33/26
USPC ....................................................... 324/304
See application file for complete search history.

(56) References Cited

U.S. PATENT DOCUMENTS

| 8,525,516 B2 * | 9/2013 | Le Prado | G04F 5/14 324/244.1 |
| 8,600,691 B2 * | 12/2013 | Griffith | G01C 19/62 702/92 |
| 9,618,362 B2 * | 4/2017 | Bulatowicz | G01C 19/62 |

FOREIGN PATENT DOCUMENTS

| WO | 2012099819 A1 | 7/2012 |
| WO | 2017042544 A1 | 3/2017 |

OTHER PUBLICATIONS

Search Report issued in French Patent Application No. 1755969 dated May 23, 2018.
Kornack, W. et al., "Nuclear Spin Gyroscope Based on an Atomic Comagnetometer", Phys. Rev. Lett., vol. 95, No. 23, p. 230801, Nov. 2005.

(Continued)

*Primary Examiner* — Reena Aurora
(74) *Attorney, Agent, or Firm* — Pearne & Gordon LLP

(57) ABSTRACT

A method for detecting rotation of a carrier utilizes a device embedded in said carrier that comprises an enclosure containing a gaseous mixture of an alkali metal and a noble gas. The method includes a step of starting up (DEM-MEOP) the device during which the noble gas is polarised by utilizing metastability exchange optical pumping. The start-up step is followed by a step of acquisition (MES-SEOP) by the device of a signal representative of said rotation during which the noble gas is maintained polarised by utilizing spin exchange optical pumping. The invention extends to the device and to an inertial navigation unit integrating said device and to an inertial navigation method implementing the method for detecting rotation of the carrier.

12 Claims, 1 Drawing Sheet

(56) References Cited

OTHER PUBLICATIONS

Fang, J. et al., "A novel Cs-129Xe atomic spin gyroscope with closed-loop Faraday modulation," Review of Scientific Instruments, vol. 84, No. 8, p. 083108, Aug. 2013.
Batz, M. et al., "Fundamentals of metastability exchange optical pumping in helium", Journal of Physics, conference series, Institute of physics publishing, Bristol, GB, vol. 294, No. I, Jun. 14, 2011 (Jun. 14, 2011), p. 12002, XP020206037.
Cohen-Tannoudji et al. Revue de Physique Appliquee, vol. 5, No. 1, pp. 102-108, 1970.
Application document as-filed for patent application entitled: Navigational Aid Method, Computer Program Product and Inertial Navigation System Therefor, U.S. Appl. No. 15/840,139, filed Dec. 13, 2017.

\* cited by examiner

METHOD FOR DETECTING ROTATION WITH RAPID START-UP OF AN ATOMIC GYROSCOPE WITH SEOP

TECHNICAL FIELD

The field of the invention is that of gyroscopes used to enable inertial navigation, namely navigation in the absence of any external reference point by the integration of movement equations. The invention relates to atomic spin gyroscopes that use the magnetic properties of atoms to carry out rotation measurements, and more particularly those of SEOP (Spin Exchange Optical Pumping) type.

PRIOR ART

The gyroscopes the most widely used at present in inertial navigation are Sagnac effect gyroscopes which have however the drawback of being relatively bulky. This is not the case of atomic spin gyroscopes, which can be subject to miniaturisation and could be used in numerous innovative applications, for example to complete GPS data in urban environments intended for drivers or pedestrians, to aid tracking of emergency services in underground environments, to increase the autonomy of drones in hostile environments, etc.

Atomic gyroscopes use the magnetic properties of atoms (their spin) to carry out rotation measurements. From the measurement of the evolution of the magnetic moments of noble gas atoms, it is possible to calculate the rotation of the gyroscope and thus that of the carrier to which it is attached. This measurement is marred by a certain number of imperfections, bias drift being the most significant among them. When this drift is of the order of 0.01 degrees/hour, the gyroscope is sufficiently precise to serve for inertial navigation, that is to say navigation independent of any external reference, carried out by double integration of the accelerations measured on the carrier.

To produce hyperpolarised noble gas atoms, atomic spin gyroscopes resort to the SEOP (spin exchange optical pumping) method. This method is based on the transfer of the angular momentum of photons to the electronic spins of alkali atoms followed by the transfer, by collision, of the angular momentum of said electronic spins of the alkali atoms to the nuclear spins of noble gas atoms.

The first atomic spin gyroscopes developed at the end of the 1960s used nuclear magnetic resonance (NMR). To do so, one or several sensitive species contained in a cell are subjected in a continuous manner to a static magnetic field, which induces a precession of their magnetic moments at a characteristic frequency, called Larmor frequency. A variation in the value of the Larmor frequency is the sign of rotation, and the magnitude of this variation makes it possible to measure the speed of rotation of the gyroscope with respect to the inertial frame of reference.

Another type of atomic spin gyroscope has been developed since the 2000s. They are co-magnetometers that are based on a mixture between a noble gas and one or several alkali metals and which, unlike NMR gyroscopes, operate in a regime where the alkali is subjected to a magnetic field very close to zero (potential external magnetic fields being cancelled by creating opposite compensation fields). This efficient architecture is described notably in the article of T. W. Kornack et al. entitled "Nuclear Spin Gyroscope Based on an Atomic Comagnetometer", Phys. Rev. Lett., vol. 95, no. 23, p. 230801, November 2005.

However, a major drawback of this device is its start-up time which, physically limited by the slowness of the spin exchange process between the alkali metal (potassium for example) and the noble gas (helium for example), is of the order of ten or so hours, whereas use in real situations typically requires a start-up time and a positioning of north of less than five minutes.

This start-up time is linked to the time constant $\Gamma_{ex}^{-1}$ for spin exchange between the alkali metal and the noble gas, because the polarisation of the latter evolves as:

$$P = P_{alk} \frac{\Gamma_{ex}}{\Gamma_{ex} + \Gamma_1} (1 - e^{-t(\Gamma_1 + \Gamma_{ex})}),$$

where $P_{alk}$ is the polarisation of the alkali metal and $\Gamma_1$ the relaxation rate of the noble gas by phenomena other than exchange.

This drawback has been identified notably by the group of Professor Fang (Beihang University, China) who has set up a research programme consisting of replacing helium 3 by another noble gas, in this particular instance xenon 129, in order to reduce the start-up time to thirty or so minutes, as for example described in the article of J. Fang et al. entitled "A novel Cs-129Xe atomic spin gyroscope with closed-loop Faraday modulation," Review of Scientific Instruments, vol. 84, no. 8, p. 083108, August 2013. However, the replacement of helium 3 by xenon 129 leads to a notable degradation of the performance of the gyroscope. Yet, in order to allow inertial navigation, a drift of the order of 0.01°/h and an ARW (angle of random-walk) of the order of 0.002°/√h are targeted.

DESCRIPTION OF THE INVENTION

The aim of the invention is to reduce the start-up time of an atomic spin gyroscope based on a SEOP type pumping, in order to offer a start-up time compatible with use in real situations of inertial navigation without however degrading the performance thereof.

It proposes for this purpose a method for detecting rotation of a carrier by means of a device embedded in said carrier and which comprises an enclosure containing a gaseous mixture of an alkali metal and a noble gas. The method includes a step of starting up the device during which the noble gas is polarised by means of metastability exchange optical pumping. Following the start-up step, the method includes a step of acquisition by the device of a signal representative of said rotation during which the noble gas is maintained polarised by means of spin exchange optical pumping.

Certain preferred but non-limiting aspects of this method are the following:
- the start-up step is finished when the polarisation conferred on the noble gas by means of metastability exchange optical pumping corresponds to a stationary polarisation conferred on the noble gas by means of spin exchange optical pumping;
- the metastability exchange optical pumping includes an excitation of the noble gas by means of a first pump laser of which the power is the controlled in such a way that the polarisation conferred on the noble gas by means of metastability exchange optical pumping reaches the stationary polarisation;
- the start-up step includes a sub-step of polarisation test including:

stopping the metastability exchange optical pumping;
starting up the spin exchange optical pumping, carrying out a first measurement of the polarisation of the noble gas followed later by carrying out a second measurement of the polarisation of the noble gas;
if the result of the second measurement is greater than the result of the first measurement, stopping the spin exchange optical pumping and starting up again the metastability exchange optical pumping; and
if the result of the second measurement is less than the result of the first measurement, the start-up step is finished.
during the start-up step, the metastability exchange optical pumping is carried out in an auxiliary cell of the enclosure connected to a main cell of the enclosure by a diffusion connection of the gaseous mixture;
the start-up step includes:
closing a first valve arranged between the main cell and an intermediate cell arranged in the diffusion connection of the gaseous mixture; and
opening a second valve arranged between the intermediate cell and the auxiliary cell.

The invention extends to an inertial navigation method implementing the method for detecting rotation of the carrier.

The invention also relates to a device for detecting rotation, comprising an enclosure containing a gaseous mixture of an alkali metal and a noble gas, and a first system for polarising the noble gas configured to carry out spin exchange optical pumping. The device further comprises a second system for polarising the noble gas configured to carry out metastability exchange optical pumping, and a controller configured to implement the start-up and acquisition steps by selectively activating the second and the first polarisation system respectively.

The alkali metal may be potassium and the noble gas helium 3.

The enclosure may include a main cell and an auxiliary cell connected to the main cell by a diffusion connection of the gaseous mixture, the second polarisation system being configured to increase the polarisation of the noble gas in the auxiliary cell and the first polarisation system being configured to maintain the polarisation of the noble gas in the main cell.

The enclosure may also include an intermediate cell arranged in the diffusion connection of the gaseous mixture, a first valve arranged between the main cell and the intermediate cell and a second valve arranged between the intermediate cell and the auxiliary cell, the controller being configured, during the start-up step, to close the first valve and open the second valve.

BRIEF DESCRIPTION OF THE DRAWINGS

Other aspects, aims, advantages and characteristics of the invention will become clear from reading the detailed description of preferred embodiments of the invention, given by way of non-limiting example, and made with reference to the appended drawings among which.

DETAILED DESCRIPTION OF PARTICULAR EMBODIMENTS

The invention relates to a method for detecting rotation of a carrier by means of a device embedded in the carrier. The embedded device, typically an atomic spin gyroscope, includes an enclosure containing a gaseous mixture of an alkali metal and a noble gas. This device is configured to acquire a signal representative of the rotation of the carrier, and more precisely a signal representative of a shift of the precession of the noble gas nuclei under the effect of the rotation.

In order to acquire such a signal, the noble gas is maintained polarised at an equilibrium polarisation by means of spin exchange optical pumping (SEOP). However, in order to reach rapidly the equilibrium polarisation of the SEOP and thus to have available a short start-up time of the device, rapid pumping is carried out by another technique, namely the so-called MEOP (Metastability Exchange Optical Pumping) method. According to this method, which does not require resorting to an alkali metal as pumping intermediate, several noble gas atoms are excited by an electrical discharge (plasma) to a metastable energy state where they can absorb light and be optically polarised. Spin exchange then occurs between the metastable excited state and the fundamental state of the noble gas. This method is currently used for the production of important volumes of hyperpolarised helium for medical imaging applications. On the other hand, its use in atomic gyroscopes has not been envisaged because in the presence of the plasma numerous undesirable effects occur, notably important drifts linked to the interaction of the different species excited by the plasma with those that are used for the rotation measurement.

Figure 1:
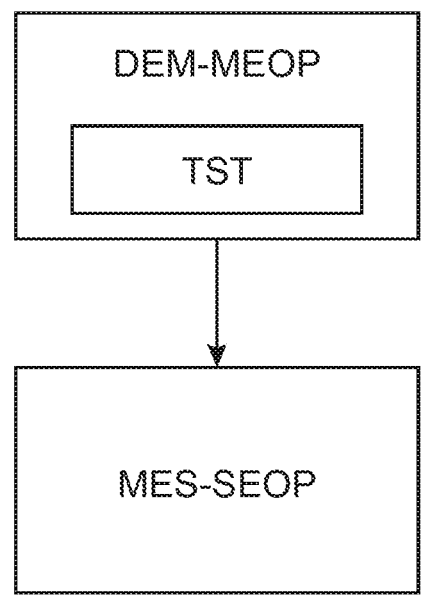
FIG. 1 is a flowchart illustrating the main steps of the method according to the invention.

Thus, and with reference to FIG. 1, the invention proposes a method for detecting rotation of a carrier which includes a step of starting up "DEM-MEOP" the embedded device during which the noble gas is polarised by means of metastability exchange optical pumping (MEOP) followed by a step of acquisition "MES-SEOP" by the embedded device of a signal representative of said rotation during which the noble gas is maintained polarised by means of spin exchange optical pumping (SEOP).

In this method, the start-up "DEM-MEOP" step is typically ended and the measuring step "MES-SEOP" is begun when the polarisation conferred on the noble gas during the start-up step by means of the metastability exchange optical pumping corresponds to the stationary polarisation conferred on the noble gas by means of a spin exchange optical pumping, namely $$P_{alk} \frac{\Gamma_{ex}}{\Gamma_{ex} + \Gamma_1}.$$

By doing so, transients are avoided during which the measurement would not be optimal.

The invention thus defines a start-up step where rapid polarisation is carried out by MEOP and a measuring step which does not suffer the imperfections induced by the plasma of MEOP because carried out while maintaining stationary polarisation by SEOP.

To do so, the device comprises a first system for polarising the noble gas configured to carry out spin exchange optical pumping and a second system for polarising the noble gas configured to carry out metastability exchange optical pumping. The device is further equipped with a controller configured to implement the method of the invention, notably by:
selectively activating and controlling the second polarisation system (MEOP) in order to increase the polarisation of the noble gas during the step of starting up the device; and selectively activating and controlling the first polarisation system (SEOP) in order to maintain the polarisation of the noble gas during the step of acquisition of the signal representative of rotation consecutive to the start-up step.

The enclosure typically contains potassium as alkali metal and helium 3 as noble gas.

The first polarisation system SEOP notably includes a first pump laser, a probe laser and a photodetector delivering the signal representative of rotation of the carrier.

The second polarisation system MEOP includes coils wound on the wall of the enclosure which, supplied by a radiofrequency signal, make it possible to produce inductive coupling of this radio-frequency and from there to induce ionisation of the gaseous mixture and thus to generate a discharge plasma capable of populating the metastable state of helium 3 (noted $2^3S_1$). This second polarisation system further includes a second pump laser capable of emitting an optical beam in the direction of the enclosure to excite the helium 3. This second pump laser is tuned to the transition between the metastable state $2^3S_1$ and the excited state $2^3P$ of helium 3, said transition corresponding to a wavelength of 1083 nm. The controller looks in the power of the second pump laser so that the polarisation conferred on the noble gas by means of MEOP reaches the stationary polarisation of SEOP. This locking may be carried out by continuously measuring the polarisation of the noble gas (for example by using a coil) and by retroactively acting on the power of the laser of the MEOP so that the polarisation of the noble gas at the end of the start-up step corresponds to the stationary polarisation of SEOP.

The time necessary to reach this stationary polarisation value (duration of the start-up step) depends on numerous parameters (pressure in the enclosure, power of the second probe laser, external magnetic field, etc.). For a typical enclosure, the duration of the start-up step is in the range 10-300 s.

It may not be easy to give a reliable analytical expression of this start-up duration and thus to define a priori and in a precise manner at what moment to switch from the start-up step to the measuring step. To overcome this difficulty, it is possible during the start-up step to reiterate a sub-step of polarisation test "TST" to check if the stationary polarisation value has been reached or not. This sub-step may include stopping MEOP, starting SEOP, carrying out of a first measurement of the polarisation of the noble gas followed later, for example several seconds after, by carrying out a second measurement of the polarisation of the noble gas.

If the result of the second measurement is greater than the result of the first measurement, the SEOP has increased the polarisation. The polarisation had not thus reached its stationary value, and the MEOP has to be continued. Thus, in such a case, the sub-step of polarisation test includes stopping the SEOP and starting up again the MEOP.

If the result of the second measurement is less than the result of the first measurement, the stationary value is reached, or even exceeded. In such a case, the start-up step is finished and the measuring step begins while keeping the SEOP going.

The measurements of the polarisation of the noble gas may be carried out by detecting the magnetic field created by the polarisation of the noble gas. To do so, the device may be used as a magnetometer exploiting the resonances of the alkali metal when its optical pumping is carried out in an amplitude modulated magnetic field. Such a procedure is for example described in Cohen-Tannoudji et al. Revue de Physique Appliquée, vol. 5, no. 1, pp. 102-108, 1970.

In such a case, each of the two measurements of the polarisation take place over several characterisation periods, the characterisation period corresponding to the square of the product of the targeted stationary polarisation multiplied by the magnetic moment of helium 3 contained in the enclosure, divided by the noise of the magnetometer in power spectral density units.

In an alternative embodiment, the instant of switching between the start-up and measuring steps cannot be detected by means of measurements of the polarisation but can be predetermined as being for example derived from learning based on recordings of switching parameters that are supplied to a statistical algorithm.

It is known that the regimes for which MEOP are the most efficient correspond to high radio-frequency intensities and low helium pressures.

Figure 2:
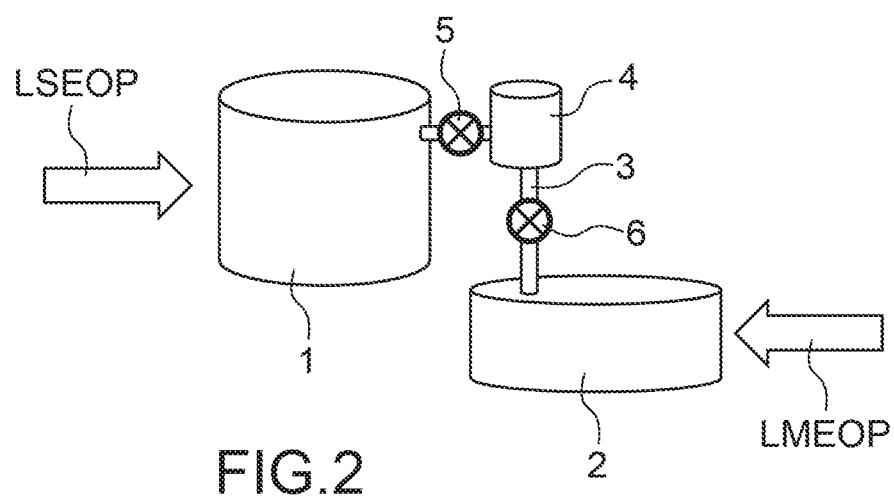
FIG. 2 is a diagram of a cell able to be used in the device according to the invention.

In a possible embodiment represented in FIG. 2, the enclosure includes a main cell 1 and an auxiliary cell 2 connected to the main cell by a diffusion connection of the gaseous mixture 2 and in which a part of the helium 3 is transferred. The first polarisation system (SEOP) is configured to maintain the polarisation of the noble gas in the main enclosure 1, by means notably of a first probe laser LSEOP arranged in such a way as to light the main cell 1. The second polarisation system (MEOP) is for its part configured to increase the polarisation of the noble gas in the auxiliary cell 2, by means notably of a second probe laser MSEOP arranged in such a way as to light the auxiliary cell 2 and coils (not represented) surrounding the auxiliary cell. Due notably to the absence of alkali metal on the walls of the auxiliary cell, it is possible to generate thereon a high intensity plasma which makes it possible to shorten the duration required to reach the desired polarisation level.

In an alternative of this embodiment, an intermediate cell 4 is arranged in the diffusion connection of the gaseous mixture 3. This intermediate cell 4 has a volume less than that of the auxiliary cell 2, for example a volume corresponding to 5-10% of that of the main cell.

The enclosure also includes a first valve 5 arranged between the main cell 1 and the intermediate cell 2 and a second valve 6 arranged between the intermediate cell 5 and the auxiliary cell 2. The controller of the device is furthermore configured, during the start-up step, to close the first valve 5 and open the second valve 3. Thus, by closing the connection to the main cell and by opening that to the auxiliary cell of greater volume, an expansion of the gas takes place which makes it possible to lower the pressure in the proportion of the respective volumes of the intermediate cell and the auxiliary cell to reach the ideal pressure regime.

The invention is not limited to the method and to the device described previously but also extends to an inertial navigation unit incorporating such a device, as well as to an inertial navigation method implemented by such a unit and including the carrying out of the method for detecting rotation of the carrier described previously.

The invention claimed is:

1. A method for detecting rotation of a carrier by a device embedded in said carrier, said device comprising an enclosure containing a gaseous mixture of an alkali metal and a noble gas, the method including:
    a step of starting up the device during which the noble gas is polarised by means of metastability exchange optical pumping; and
    following the step of starting up, a step of acquiring, by the device, a signal representative of said rotation during which the noble gas is maintained polarised by means of spin exchange optical pumping.

2. The method according to claim 1, wherein the step of starting up is finished when the polarisation conferred on the noble gas by means of the metastability exchange optical pumping corresponds to a stationary polarisation conferred on the noble gas by means of the spin exchange optical pumping.

3. The method according to claim 2, wherein the metastability exchange optical pumping includes an excitation of the noble gas by means of a first pump laser of which the power is controlled in such a way that the polarisation conferred on the noble gas by means of the metastability exchange optical pumping reaches the stationary polarisation.

4. The method according to claim 2, wherein the step of starting up includes a sub-step of testing polarisation which includes:
   stopping the metastability exchange optical pumping;
   starting up the spin exchange optical pumping, carrying out a first measurement of the polarisation of the noble gas followed later by carrying out a second measurement of the polarisation of the noble gas;
   if the result of the second measurement is greater than the result of the first measurement, stopping the spin exchange optical pumping and starting up again the metastability exchange optical pumping; and
   if the result of the second measurement is less than the result of the first measurement, the step of starting up is finished.

5. The method according to claim 1, wherein, during the step of starting up, the metastability exchange optical pumping is carried out in an auxiliary cell of the enclosure connected to a main cell of said enclosure by a diffusion connection of the gaseous mixture.

6. The method according to claim 5, wherein the step of starting up includes:
   closing a first valve arranged between the main cell and an intermediate cell (4) arranged in the diffusion connection of the gaseous mixture; and
   opening a second valve arranged between the intermediate cell and the auxiliary cell.

7. An inertial navigation method including the detection of rotation of a carrier in accordance with the method according to claim 1.

8. A device for detecting rotation, comprising an enclosure containing a gaseous mixture of an alkali metal and a noble gas, a first system for polarising the noble gas configured to carry out spin exchange optical pumping, and a second system for polarising the noble gas configured to carry out metastability exchange optical pumping, and a controller configured to:
   during a step of starting up the device, selectively activating and controlling the second polarisation system in order to increase the polarisation of the noble gas; and
   during a step, consecutive to the step of starting up, of acquiring, by the device, a signal representative of said rotation selectively activating and controlling the first polarisation system in order to maintain the polarisation of the noble gas.

9. The device according to claim 8, wherein the alkali metal is potassium and the noble gas is helium 3.

10. The device according to claim 8, wherein the enclosure includes a main cell and an auxiliary cell connected to the main cell by a diffusion connection of the gaseous mixture, and wherein the second polarisation system is configured to increase the polarisation of the noble gas in the auxiliary enclosure and the first polarisation system is configured to maintain the polarisation of the noble gas in the main enclosure.

11. The device according to claim 10, further including an intermediate cell arranged in the diffusion connection of the gaseous mixture, a first valve arranged between the main cell and the intermediate cell and a second valve arranged between the intermediate cell and the auxiliary cell, and wherein the controller is further configured, during the start-up step, to close the first valve and open the second valve.

12. An inertial navigation unit including a device according to claim 8.

* * * * *